(12) United States Patent
Adams et al.

(10) Patent No.: US 6,248,455 B1
(45) Date of Patent: Jun. 19, 2001

(54) ALLOY-PLATED SHEET STEEL CURED WITH A THIN LAYER OF INSULATING POLYMER MATERIAL FORMING AN ELECTRICALLY NONCONDUCTIVE BREACHABLE METAL SUBSTRATE

(75) Inventors: Jacklin Ann Adams, Cary; Joel Ray McLean, Raleigh, both of NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/219,569

(22) Filed: Dec. 22, 1998

(51) Int. Cl.[7] .................................................... B32B 15/08
(52) U.S. Cl. .......................................... 428/626; 428/681
(58) Field of Search .................................. 428/626, 624, 428/648, 655, 681

(56) References Cited

U.S. PATENT DOCUMENTS

| | | |
|---|---|---|
| 4,388,371 | 6/1983 | Bolon et al. .......................... 428/383 |
| 5,795,660 | 8/1998 | Yoshimi et al. ...................... 428/626 |

*Primary Examiner*—Francis J. Lorin
(74) *Attorney, Agent, or Firm*—George E. Grosser; Andrew Dillon

(57) ABSTRACT

The present invention relates to an electrically insulating polymer coating on a conductive metal substrate, especially zinc and tin-plated sheet steel. The polymer is applied to at least one side of the sheet, the amount being adequate to create a uniform layer of 0.5 to 0.8 micrometers thickness after curing. The polymer coated sheet is heat cured at 200° C. to 210° C. for 10–15 minutes. The thickness of the polymer layer is selected to be within a specified range. The range is determined based upon subsequent manufacturing operations which require an electrically conductive path between a component and the metal substrate. The curing conditions are selected for the dual purpose of heat curing the polymer to the substrate surface as well as to stress relieve the tin or zinc-plated sheet steel. This treatment helps to prevent tin whisker growth and improves the corrosion resistance of the substrate.

14 Claims, 5 Drawing Sheets

ALLOY-PLATED SHEET STEEL CURED WITH A THIN LAYER OF INSULATING POLYMER MATERIAL FORMING AN ELECTRICALLY NONCONDUCTIVE BREACHABLE METAL SUBSTRATE

BACKGROUND OF THE INVENTION

1. Technical Field

The present invention relates in general to insulating polymer coatings on conductive metal surfaces, and in particular to polymer-cured zinc or tin-electroplate steel sheets. Still more particularly, the present invention relates to providing electrically nonconductive and corrosion resistant metal support surfaces in computer applications wherein the insulating surface can be breached by soldering or screws to create a conductive path between various computer components.

2. Description of the Related Art

Coating electrically conductive metal surfaces with polymeric materials is of interest in various electronics applications. The benefits of such polymer coatings are typically two-fold: protection of the metal surface from corrosion and to change the electrical properties of the substrate surface. The art in this area is diverse, with inventions distinguished by variations ranging from the identity of the substrate-metal surface on which the polymer is applied to the identity of the polymer. Also, various inventions have focused on the method of coating the metal surface with the polymer coating.

Palisin (U.S. Pat. Nos. 3,961,993 and 3,977,839) discloses a method of coating metal surfaces for corrosion protection, specifically, zinc, cadmium, nickel, or chromium-plated surfaces. The method in Palisin involves heat curing multiple layers of polymers onto the metal surface. Savelkouls (U.S. Pat. No. 4,101,356) discloses a method of polymer coating sheet steel by directing radio frequency radiation through a polymer stratum onto the steel surface. More complex applications followed in the Bolon et al. (U.S. Pat. No. 4,388,371) invention wherein several layers of various conductive and insulating polymer materials are heat cured onto an electrically conductive substrate.

Some more recent inventions include acrylic polymer coatings on steel articles that exhibit high corrosion resistance and low hydrogen reembrittlement characteristics (Hsu et al., U.S. Pat. No. 4,529,487); using conductive polyanaline coating on steel, iron, or aluminum substrates to impart corrosion resistance upon the substrate (Wrobleski et al., U.S. Pat. No. 5,658,649); and application of conductive polyaniline to metal substrates through evaporation of a solution of the polymer in contact with the metal surface (MacDiarmid et al., U.S. Pat. No. 5,645,890). More recently, van Ooij et al. (U.S. Pat. No. 5,759,629) have disclosed a method of imparting corrosion resistance to steel and aluminum sheets by paint-coating hydrolyzed vinyl silane to the surface, followed by application of other polymers.

Yoshimi et al. (U.S. Pat. No. 5,795,660) have invented a method of imparting corrosion resistance to chromate film-coated zinc alloy metal sheets by application of an organic resin on the metal substrate in conjunction with the chromate film. The resin film has a thickness of between 0.2 and 2.0 micrometers and contains various functional groups. The application is directed primarily to substrates exposed to highly corrosive environments, especially automobile parts exposed to salted road surfaces.

Some problems involving the application of metal surfaces in electronic components remain unsolved. In particular, the prevention of zinc or tin whisker growth on zinc or tin-plated sheet steel substrates is of great importance. The use of tin-plated sheet steel has grown recently due to the lower cost of materials over stainless steel. Generally, this tin-plated sheet steel is 0.008 to 0.010 inches in thickness, has a so called No. 25 or No. 50 tin coating weight on both sides, and is available world wide for use as EMC liners or similar computer chassis parts. However, tin whisker growth limits the practical use of this substrate for its desired electronics applications. Tin whiskers are hairlike crystals which grow spontaneously from the surface of the tin sheet steel. The growth of tin whiskers may result in flash-over, short circuits, and audible noise in electronic applications. Thus, there is a need to avoid this problem while exploiting the advantages of tin-plated sheet steel.

Polymer coatings can greatly enhance the usefulness of tin-plated sheet steel. By roll coating and heat curing a thin organic layer onto the tin plated steel, a significant corrosion resistance improvement can be achieved, while at the same time decreasing the tin whisker problem. Additionally, by using a specific type of organic coat and controlling the cure temperature, the zinc or tin-plated sheet steel can be stress relieved to help eliminate the growth of tin whiskers.

Although organic coated zinc or tin plated steel is already available, it is not available in the desired organic coating thickness. The thickness of the coating is critical in electronics applications because there is a desire to balance the conflicting need for imparting corrosion resistance on the one hand, while allowing for electrical connections to be made on the metal substrate on the other. If the polymer layer is too thick, it is difficult to solder through and dissipate the resin, thus making an electrical connection. If the polymer layer is too thin, corrosion resistance is diminished and tin whisker growth increases.

It would be desirable, therefore, to provide a method for an improved alloy plated sheet steel cured with a thin layer of insulating polymer material. The material would be characterized as a nonconductive breachable metal substrate due to its insulative properties and ability to easily breech the insulative layer to form electrically conductive pathways. Such a material would be ideal for use in products ranging from desktop PC's to high end server products and also other applications in the automotive industry.

SUMMARY OF THE INVENTION

It is therefore one object of the present invention to provide a zinc or tin-plated sheet steel substrate that is noncorrosive.

It is another object of the present invention to provide a zinc or tin-plated sheet steel that is electrically nonconductive on the surface.

It is yet another object of the present invention to provide an electrically nonconductive substrate that allows for the creation of an electrically conductive pathway to be formed on or through the surface of the substrate.

The foregoing objects are achieved as is now described. The present invention is directed toward a method for treating a zinc or tin-plated sheet steel substrate with a layer of electrically insulating polymer coating. The polymer is applied to at least one side of the sheet, the amount being adequate to create a uniform layer of 0.5 to 0.8 micrometers thickness after curing. The polymer coated sheet is heat cured at 200° C. to 210° C. for 10 to 15 minutes. The thickness of the polymer layer is selected to be within a specified range. The range is determined based upon subsequent manufacturing operations which require an electrically conductive path between a component and the metal substrate.

The curing conditions are selected for the dual purpose of heat curing the polymer to the substrate surface as well as to stress relieve the tin-plated sheet steel. This treatment helps prevent tin whisker growth and improves the corrosion resistance of the substrate.

The improved polymer coating on zinc or tin-plated sheet steel allows electrical connections to be made to the substrate surface by soldering, which dissipates the thin polymer layer and exposes the conductive metal surface to the solder, and also by mechanical means such as screws, bolts, washers, etc. Some of the possible applications of the new invention are housings for the hard drive and floppy drive units of a computer, support surfaces for computer chip boards, power supply unit housing, backing plates for external plug-in connections, and other chassis uses.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
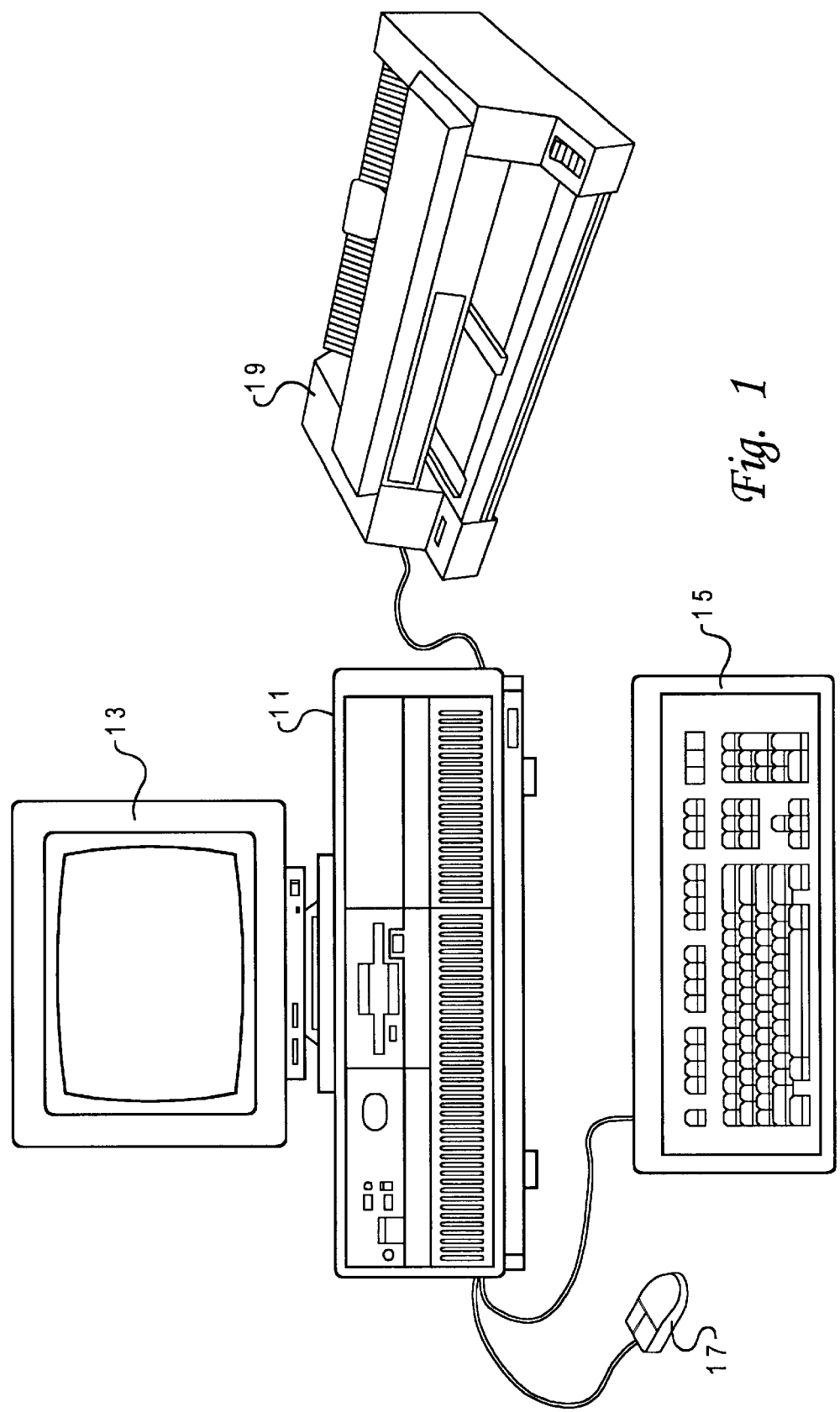
FIG. 1 depicts a typical personal computer (PC) with its common peripheral devices.

With reference now to the figures, and in particular with reference to FIG. 1, a general depiction of a personal computer (PC) is shown from the front view. The chassis 11 is where the memory storage devices and central processing unit is located. Other peripheral devices can be coupled to the computer to facilitate input and output. Cathode Ray Tube (CRT) 13, keyboard 15, mouse 17, and printer 19 are devices used to facilitate input and output to and from the PC.

Figure 2:
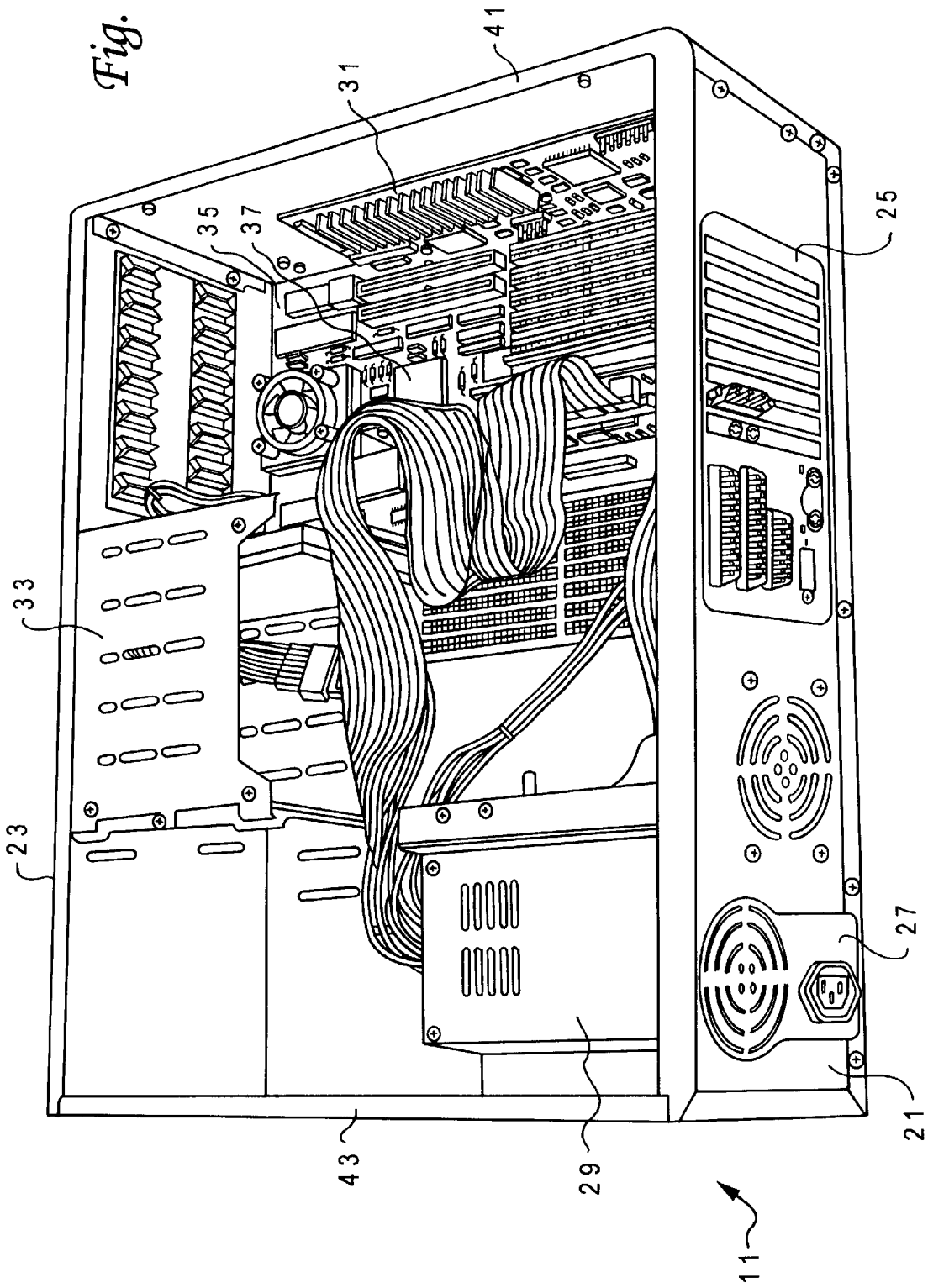
FIG. 2 is a view of the interior of the chassis of the computer with its common components.

FIG. 2 shows the chassis 11 of the PC with the top open. The majority of the applications for the present invention will be best used as part of the chassis 11 and within the chassis, and the following description outlines some of the potential uses for the present invention. The back 21 of the chassis, the front 23, and the sides 41 and 43 may all be made from the improved alloy-plated sheet steel of the present invention. Backing plate 25 is the support structure for plug-in connections between the computer components and peripheral devices. The external AC power connection is at plate 27, and the internal power unit is housed at 29.

Further in FIG. 2, the disk drive units are housed in plate 33. Computer board 35 contains sensitive electronic connections to various storage and transfer devices. For instance, board 31 is connected to 35 such that electrical connections are made to the components on board 31. The central processing unit (CPU), a vital feature to the functioning of the computer, is at 37, being attached to board 35.

The CPU may be exposed as shown in FIG. 2, or may be housed in one of a number of configurations.

Figure 3A:
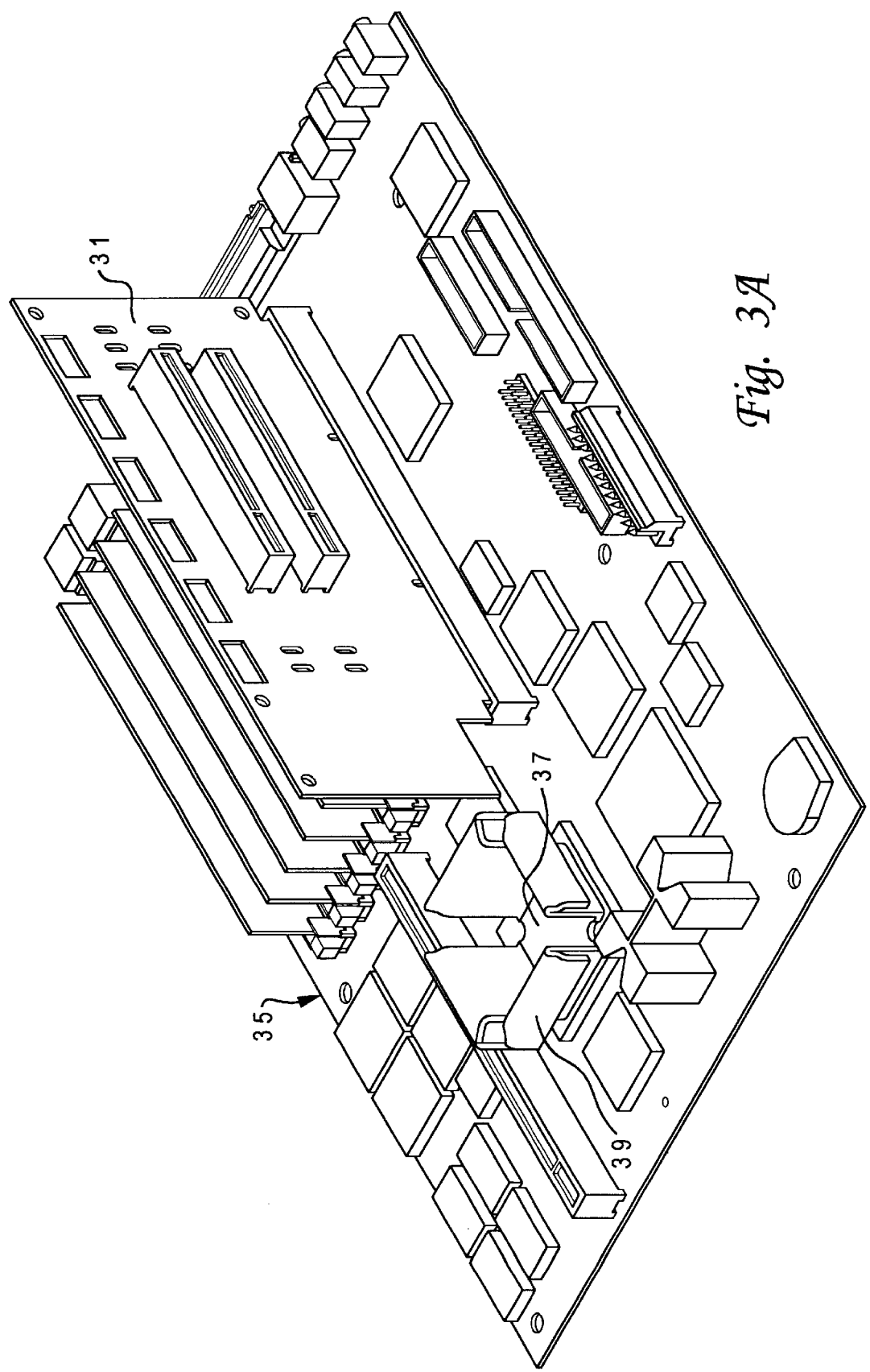
FIG. 3A and FIG. 3B depict a typical computer circuit board.
Figure 3B:
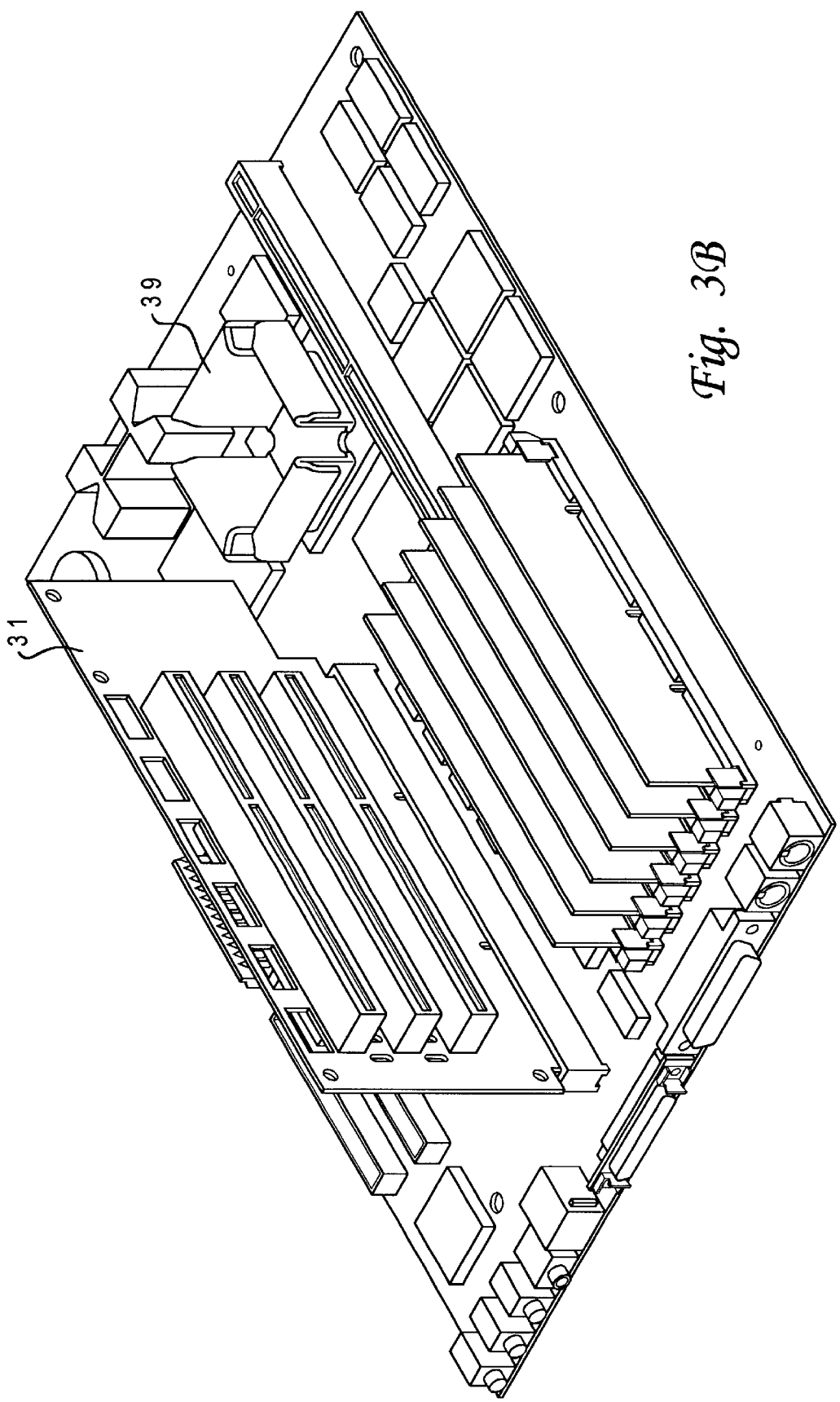

FIGS. 3A and 3B show two views of one of the configurations possible for housing a CPU. The CPU 37 can be contained and coupled to housing 39, the housing 39 being attached to board 35. The coupling of CPU 37 to the housing 39 must be done such that electrical pathways are possible from the CPU to external portions of the board 35, while maintaining the nonconductive character of the housing 39 and board 35. Due to the sensitive nature of the electrical connections that must be made, it is important that the support structures for these parts do not corrode, especially given the variety of environments the PC is likely to be encounter.

The desired application, as exemplified above, of the invention is to provide an electrically insulating, structural rigid, noncorroding and economical material through which electrical pathways can be easily made. The zinc, and in particular tin-plated, sheet steel provides structural rigidity and electrical conductivity when desired. The noncorrosive and nonconducting character of the invention is accomplished by treating tin-plated steel with a polymer, and applying a curing procedure to the material. The curing procedure accomplishes two objectives. First, the curing effects the physical attachment of the polymer layer to the metal substrate surface. Second, curing stress relieves the substrate to decrease the formation of tin whiskers which can destroy the desired characteristics of the material.

Figure 4:
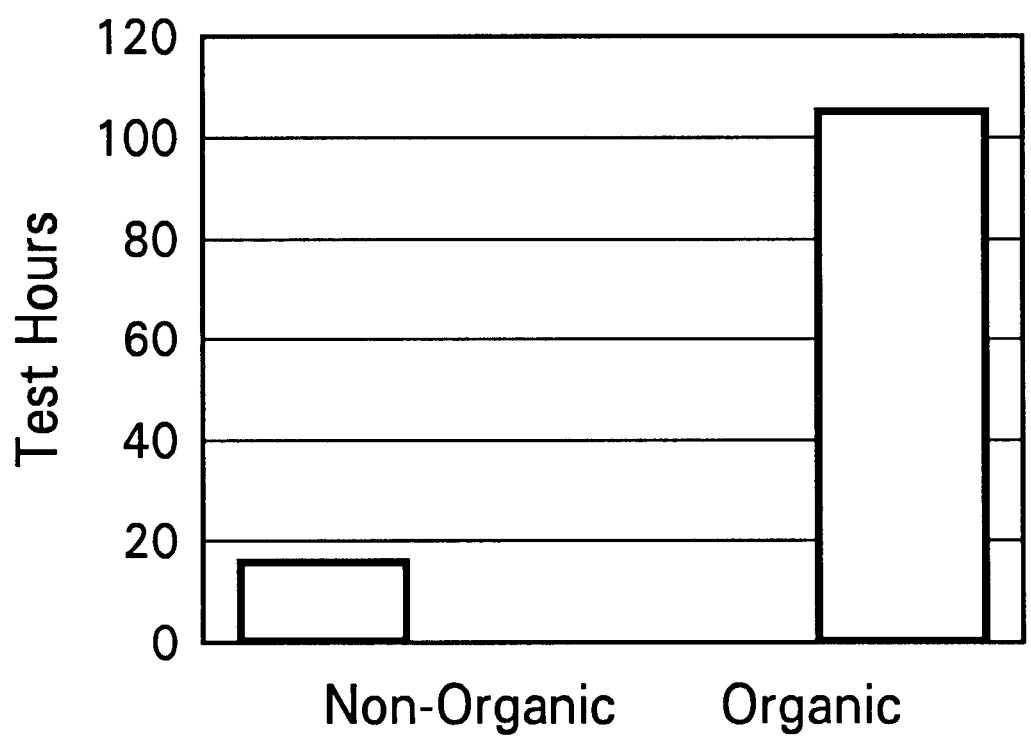
FIG. 4 depicts data showing the average hours to white rust of organic coated metal verses non-coated metal.

Typically, tin-plated sheet steel of one embodiment of the invention is 0.008 inches to 0.010 inches in thickness, and has a so called No. 25 or No. 50 tin coating weight on both sides of the sheet. The material is less expensive than stainless steel, but does not have the same corrosion resistance. Coating the alloy-plated sheet steel greatly improves the corrosion resistance as seen in FIG. 4, which is a bar graph of data comparing non-coated zinc-plated material with polymer coated material under a five percent salt spray fog under ASTM B1117 testing conditions. The results are identical for tin-plated sheet steel. There is a five-fold improvement in corrosion resistance of the polymer coated material over the non-coated sheet steel.

The polymer is roll-coated onto the metal substrate, followed by heat curing. The polymer coating is applied so that the cured layer of polymer on the substrate is 0.5 to 0.8 micrometers in thickness. In one embodiment of the invention, the polymer/substrate combination is cured at 200° C. to 210° C. for 10 to 15 minutes. The temperature is chosen to be close to but less than that of tin, the melting point of tin being 223° C. By this choice of curing temperature, not only is the polymer cured onto the substrate surface, but the tin is stress relieved. The heat cycle removes any inherent residual stresses left from the tin electroplating operation that forms the tin-plated steel. Removing these stresses helps reduce the phenomenon of tin whisker growth which can cause electrical shorting.

Various polymers may be used in the present invention to achieve the desired results of creating an electrically nonconductive, breachable metal surface. The polymer layer should primarily be acrylic resin. Acrylic resins are thermoplastic polymers or copolymers of the esters of acrylic acid ($H_2C$=CHCOOH) and alpha methyl acrylic acid ($H_2C$=C($CH_3$)COOH). The monomers are colorless liquids that polymerize readily in the presence of light, heat, or catalysts such as benzoyl peroxide.

A typical acrylic polymer is polymethyl methacrylate, which has a repeating functional group of —COOCH$_3$, a methyl ester. In practice, copolymers of methyl methacrylate and many other monomers are encountered, among the principal ones being copolymers of methylmethacrylate with such substances as ethyl acrylate, methyl acrylate, styrene, allyl methacrylate, cyclohexyl methacrylate, acrylonitrile, and methacrylic anhydride.

The acrylic resins must be heat cured onto the surface of the tin-plated sheet steel. There are two major factors which affect the adhesion of coatings to the surface of various substrates. First is the roughness of the surface, while the second is the affinity of the coating for the surface. The first is called mechanical adhesion, while the second is specific adhesion. If the surface of the substrate is sufficiently rough, practically all coating materials will adhere to it. However, some coatings may be peeled fairly readily from smooth surfaces. Invariably, these coatings are high-molecular-weight materials such as nitrocellulose lacquers, or amino resins which are polymerized during the curing operation.

High molecular weight polymers have great cohesive strength, their cohesion strength being greater than that for their adhesion to smooth metal. Thus, to improve the adhesion of the polymer to metal sheet, two general methods are useful. First, is to add relatively large proportions of low-molecular weight resins and plasticizers to reduce the cohesion of the polymer, and the second is to add relatively small proportions of a highly polar material, such as the maleic acid in vinyl polymers, which increases the specific adhesion through an increase in the polarity of the polymer. The more highly polar polymer binding more efficiently to the polar metal surface.

High molecular weight polymer coatings have poor adhesion to smooth metal surfaces. This is due to the extremely high cohesion between the large molecules of the coatings—they have a greater attraction among themselves than they have for the metal. The addition of plasticizers, low molecular weight resins improves adhesion, but weakens the strength of the coating on the metal surface. Zinc and tin in surfaces are typically rough enough to overcome the this problem. Tin and zinc metal surfaces allow large mechanical adhesion which helps to overcome potentially low specific adhesion of larger molecular weight, and hence stronger, polymers. Thus, by using tin or zinc-plated sheet steel substrate, a strong yet adhesive acrylic resin can be used.

Several different acrylic polymers can be used as the resin coating on the alloy coated substrate. Several have trade names such as Morton First Coat™ (#MP-612Y9, Morton Inc.), and Trigard™ (Triumph Industries). The latter is a water-based acrylic coating. These, and other acrylic polymer coatings such as the traditional polymethyl methacrylate polymer have several advantageous properties. The resins are resistant to many aqueous inorganic reagents, including dilute acids and bases. They are quite resistant to alkaline saponification. Further, these polymers are colorless. Combined with the unusually good outdoor weathering behavior, its optical properties make these polymers ideal for computer applications, especially PC applications.

Once cured, the treated substrate is electrically nonconductive on its exterior surface. However, due to the nature of the polymer layer and its thickness, it can be easily breached in order to form electrical pathways. Breaching can be accomplished by mechanical means such as drilling a hole into the treated substrate and placing a screw or bolt through the hole and attaching a conductive wire, for example. Also, the treated substrate can be breached by soldering, wherein the heat used to solder an electrically conductive material to the substrate dissipates the polymer layer. The small amount of polymer that may remain does not interfere with the solder material making the electrical connection.

The present invention has many advantages over the prior art. The thickness of the polymer coating will combine the benefits of creating an electrically non-conductive surface and an easily penetratable surface for making electrical contacts when desired. This is ideal for PCs, where there are many surfaces within and outside of the computer that require an insulating surface, while being easily breachable.

The tin and zinc plating on the sheet steel offers the advantage of reduced tin whisker growth, while providing a rough surface for the polymer for maximal specific adhesion. Also, the curing process used further enhances the reduced tin whisker growth properties of the coated substrate. This is a vital property to the invention. Since PCs are exposed to various different climates and office environments, they must be able to withstand rapidly changing conditions. The present invention increases the usefulness and longevity of computers and other devices when implemented.

While the invention has been particularly shown and described with reference to a preferred embodiment, it will be understood by those skilled in the art that various changes in form and detail may be made therein without departing from the spirit and scope of the invention.

What is claimed is:

1. A method for making nonconductive breachable metal material, the method comprising the steps of:

providing a tin-plated sheet steel substrate;

applying a layer of electrically insulating polymer to at least one surface of the substrate, the amount being adequate to create a uniform layer of 0.5 to 0.8 micrometers thickness after curing; and exposing the organic polymer coated substrate to a temperature in the range from about 200° C. to 210° C. for a time sufficient to effect curing of the polymer coated substrate.

2. The method of claim 1, wherein the curing temperature is selected to be close to the melting point of tin.

3. The method of claim 1, wherein the polymer coated subtrate is used in internal computer components that require a rigid nonconductive support that can be breached at a specific location to form a conductive pathway.

4. The method of claim 3, wherein the substrate is breached by soldering a conductive element to the surface of the substrate.

5. The method of claim 3, wherein the substrate is breached by piercing the substrate with a screw or bolt for coupling a conductive element to the substrate.

6. The method of claim 3, wherein the computer component is a backing plate for external connectors into the computer.

7. The method of claim 3, wherein the computer component is a housing that contains the central processing unit.

8. The method of claim 3, wherein the computer component is a support attachment for a computer chip board.

9. An improved nonconductive breachable metal material, the material comprising:

a tin-plated sheet steel substrate; and an electrically insulating organic polymer coating on at least one surface of the substrate that is 0.5 to 0.8 micrometers thick after curing at 200° C. to 210° C. for 10 to 15 minutes.

10. The improved nonconductive breachable metal material of claim 9, wherein the alloy plated onto the sheet steel is zinc.

11. The improved nonconductive breachable metal material of claim 10, wherein the curing temperature is selected to be close to the melting point of tin.

12. The improved nonconductive breachable metal material of claim 9, wherein the insulating polymer is an acrylic resin.

13. The improved nonconductive breachable metal material of claim 12, wherein the insulating polymer is selected from a group consisting of but not limited to Morton First Coat™ (#MP-612Y9) and Trigard™.

14. The method of claim 1 wherein the sheet steel substrate is zinc-plated.

* * * * *